US007278469B2

(12) United States Patent
Sasaki et al.

(10) Patent No.: US 7,278,469 B2
(45) Date of Patent: Oct. 9, 2007

(54) THIN SHEET TYPE HEAT PIPE

(75) Inventors: Yasumi Sasaki, Tokyo (JP); Yasuyuki Ooi, Tokyo (JP)

(73) Assignee: The Furukawa Electric Co., Ltd. (JP)

( * ) Notice: Subject to any disclaimer, the term of this patent is extended or adjusted under 35 U.S.C. 154(b) by 0 days.

(21) Appl. No.: 10/430,923

(22) Filed: May 7, 2003

(65) Prior Publication Data

US 2004/0069460 A1    Apr. 15, 2004

(30) Foreign Application Priority Data

May 8, 2002   (JP)  .............................. 2002-132973
Apr. 10, 2003  (JP)  .............................. 2003-106377

(51) Int. Cl.
    H05K 7/20    (2006.01)
(52) U.S. Cl. .......................... 165/104.26; 165/104.33; 165/46; 361/700
(58) Field of Classification Search .......... 165/104.26, 165/104.33; 361/700
    See application file for complete search history.

(56) References Cited

U.S. PATENT DOCUMENTS 3,834,457 A * 9/1974 Madsen ................. 165/104.26
4,461,343 A * 7/1984 Token et al. ............ 165/104.26
5,560,423 A * 10/1996 Larson et al. .......... 165/104.26
5,642,776 A * 7/1997 Meyer et al. .......... 165/104.26
6,148,906 A * 11/2000 Li et al. ................. 165/104.33
6,446,706 B1* 9/2002 Rosenfeld et al. ............ 165/46
2003/0136551 A1* 7/2003 Bakke .................... 165/104.26

FOREIGN PATENT DOCUMENTS

JP         2001-165584        6/2001

* cited by examiner

*Primary Examiner*—Allen J. Flanigan
(74) *Attorney, Agent, or Firm*—Cantor Colburn LLP

(57) ABSTRACT

The present invention has proposed a thin sheet type heat pipe comprising: a hermetically sealed container which is formed of foil sheets opposed and jointed at peripheral portions; at least one spacer which is movably housed in said container and has a fluid path to exert a capillary force; at least one spacer which is movably housed in said container and has no fluid path; and a working fluid enclosed in said container.

18 Claims, 17 Drawing Sheets

FIG. 14A
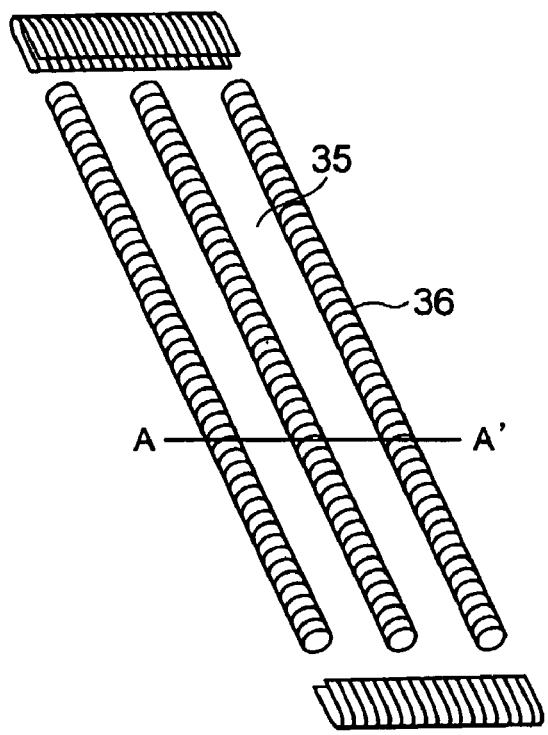
FIG. 14B
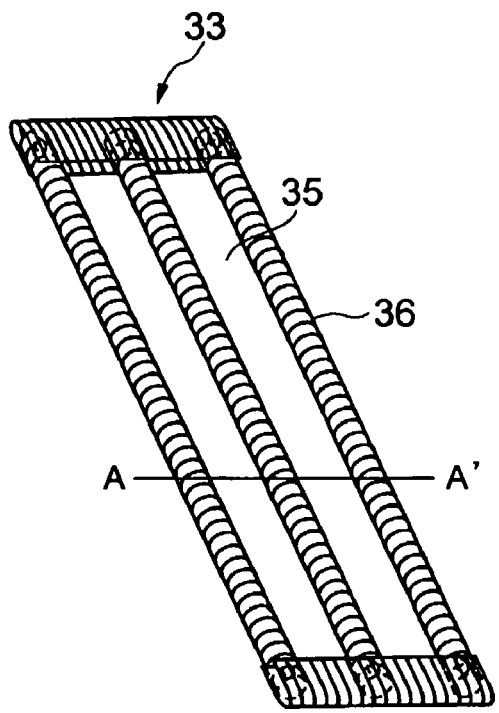
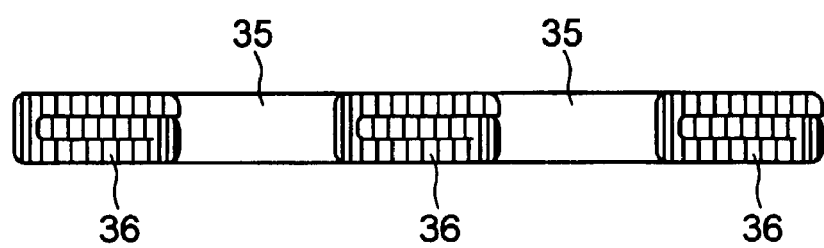
FIG. 15

THIN SHEET TYPE HEAT PIPE

BACKGROUND OF THE INVENTION

1. Field of the Invention

The present invention relates to a sheet type heat pipe for efficiently cooling high heat generating components such as semiconductors, and particularly to a sheet type heat pipe for efficiently cooling a semiconductor or the like which is mounted in an extremely thin housing.

2. Related Art

Recently, built in electronic equipment is a component with high power and high density, such as a micro processor. As a micro processor becomes extremely higher in density and performs processing such as computing and control at high speed, it generates a large amount of heat. In order to cool such a component with high power and high density like a semiconductor chip, there have been proposed various cooling systems. One of typical cooling systems is a heat pipe.

Heat pipes take various shapes, including a round-pipe type (cylindrical) heat pipe and a plate type heat pipe. Preferably used to cool a component to be cooled of an electronic device such as a CPU is a plate type heat pipe because the plate type heat pipe can be readily mounted onto the component to be cooled and can assure a large contact surface therewith.

Further, heat pipes are classified by a position where a component to be cooled is mounted, that is, whether the component to be cooled is mounted on the upper side of a heat pipe (Top Heat Mode) or lower side of a heat pipe (Bottom Heat Mode). For the Bottom Heat Mode, a fluid circulates by the gravity. On the other hand, for the Top Heat Mode, a fluid must be circulated against the gravity, usually by way of capillary action of a wick.

A space is provided in a heat pipe to be used as a fluid path for a working fluid. The working fluid in the space changes its phase by evaporation, condensation and the like and is moved. Such phase transformation and movement of the working fluid allows heat to be moved.

Detailed description is made below about a heat pipe which has a hermetically sealed cavity and allows heat to be transferred by phase transformation and movement of a working fluid contained in the cavity At a heat absorbing side of the heat pipe, heat generated by a component to be cooled and conducted in a material of a container of the heat pipe is absorbed as latent heat to vaporize a working fluid. The vaporized working fluid is moved to a heat dissipating side of the heat pipe. At the heat dissipating side, the vaporized working fluid is condensed to release a latent heat and to become liquid again. Then, the liquefied working fluid flows back to the heat absorbing side (circulation). Such phase transformation and movement of the working fluid allows heat to be moved.

For a gravity type heat pipe, a working fluid which becomes liquid by phase transformation is moved (circulated) to the heat absorbing side by the gravity.

In these days, a housing in which an above-described chip or the like is mounted becomes thinner little by little, and a heat pipe correspondingly becomes thinner.

A sheet type heat pipe is disclosed in a Japanese Laid-Open Patent Publication No. 2001-165584 (which is hereinafter referred to as "related art". In the related art, a plurality of columnar spacers jointed to a container.

However, a sheet type heat pipe of the related art presents the following problems.

One of them is that spaces between columnar spacers are uneven, which may exhibit a wide range of performance, lacking in reliability. Next, since columnar spacers are jointed to a container by an adhesive agent or the like, noncondensable gas is generated within the container, which may impair the long-term reliability. Further, when a main body of the container is bent, a jointed columnar spacer is fallen off the container, which may deteriorate performance. Furthermore, the individual difference may be larger among the products. Another problem lies in that a large number of components and steps are required.

Further, when a foil for forming a container is thinner to reduce the thickness, the own strength of the foil is significantly lowered. Then, a recess occurs along the fluid path by ambient pressure, the fluid path becomes narrower, causing accumulation of the fluid to block the fluid path. Furthermore, there occurs irregularity in the surface of the container, raising a problem that the container surface in contact with a component to be cooled is reduced.

SUMMARY OF THE INVENTION

It is an object of the present invention to provide a thin sheet type heat pipe, mounted in an extremely thin housing, for efficiently cooling a heat generating component such as a CPU.

The inventors of the present invention have intensively studied in order to solve the above-mentioned problems of the related art. As a result, they have found that when a hermetically sealed container is formed by jointing peripheral portions of two foil sheets and a spacer, which brings out a capillary force and has a fluid path, is movably housed in the container, there exhibits flexibility to allow the container to be bent smoothly, thereby making it possible to provide a thinner heat pipe while assuring an even fluid path.

The present invention was carried out based on the above-mentioned study result. A thin sheet type heat pipe according to a first embodiment of the present invention is a thin sheet type heat pipe comprising: a hermetically sealed container which is formed of foil sheets jointed at peripheral portions; at least one spacer including a spacer having a fluid path and exerting a capillary force, which is movably housed in the above-mentioned container; and a working fluid enclosed in said container.

A thin sheet type heat pipe according to a second embodiment of the present invention is a thin sheet type heat pipe in which the above-mentioned at least one spacer comprises a sheet and said fluid path is formed in a longitudinal direction of said sheet.

A thin sheet type heat pipe according to a third embodiment of the present invention is a thin sheet type heat pipe in which the above-mentioned at least one spacer comprises: a first spacer which is a sheet with a fluid path formed in a longitudinal direction of the sheet; and a second spacer which is a sheet with a fluid path formed in a direction perpendicular to the fluid path of the above-mentioned first spacer, the above-mentioned first spacer and the above-mentioned second spacer being arranged movably.

A thin sheet type heat pipe according to a fourth embodiment of the present invention is a thin sheet type heat pipe in which the above-mentioned at least one spacer comprises: a first spacer which is a sheet with a plurality of fluid paths formed in parallel and in a longitudinal direction of the sheet; and two third spacers which are sheets with no fluid path, the above-mentioned first spacer being sandwiched by the above-mentioned two third spacers, and the above-mentioned first spacer and the above-mentioned two third spacers being movably arranged.

A thin sheet type heat pipe according to a fifth embodiment of the present invention is a thin sheet type heat pipe in which the above-mentioned two third spacers are different in thickness from each other.

A thin sheet type heat pipe according to a sixth embodiment of the present invention is a thin sheet type heat pipe in which the above-mentioned at least one spacer comprises one-piece spacers of at least two out of three kinds including: a first spacer; a second spacer; and a third spacer, a plurality of holes being provided between the above-mentioned one-piece spacers of different kinds, the above-mentioned one piece spacers being folded at a portion at which the holes are formed in such a manner that one spacer of the one-piece spacers is superimposed on another.

A thin sheet type heat pipe according to a seventh embodiment of the present invention is a thin sheet type heat pipe in which the above-mentioned second spacer is made of a mesh.

A thin sheet type heat pipe according to an eighth embodiment of the present invention is a thin sheet type heat pipe in which the above-mentioned at least one spacer comprises: a first spacer which is a sheet with a plurality of fluid paths formed in parallel and in a longitudinal direction of the sheet; and two fourth spacers which are sheets each having communication paths at portions corresponding to ends of the fluid paths of the above-mentioned first spacer and having a plurality of holes at a predetermined portion in a center part, the above-mentioned first spacer being sandwiched by the above-mentioned two fourth spacers, the foils of the above-mentioned container being jointed by spot welding at portions corresponding to the holes of the fourth spacers so that the spacers are movably arranged.

A thin sheet type heat pipe according to a ninth embodiment of the present invention is a thin sheet type heat pipe in which the above-mentioned first spacer is formed of a mesh sheet.

A thin sheet type heat pipe according to a tenth embodiment of the present invention is a thin sheet type heat pipe in which the above-mentioned first spacer is formed by wrapping a mesh around the sheet.

A thin sheet type heat pipe according to a eleventh embodiment of the present invention is a thin sheet type heat pipe in which the above-mentioned first spacer is formed of hollowing in a tatami mesh fluid paths arranged in parallel and in a longitudinal direction.

A thin sheet type heat pipe according to a twelfth embodiment of the present invention is a thin sheet type heat pipe in which the above-mentioned container is a container of a predetermined shape having a curved portion, and the above-mentioned spacer corresponds in shape to said container.

A thin sheet type heat pipe according to a thirteenth embodiment of the present invention is a thin sheet type heat pipe in which a surface of the above-mentioned first spacer, the above-mentioned second spacer, each of the above-mentioned third spacers or each of the above-mentioned fourth spacers is finely roughened.

A thin sheet type heat pipe according to another embodiment of the present invention is a thin sheet type heat pipe comprising: a hermetically sealed container which is formed of foil sheets opposed and jointed at peripheral portions; at least one spacer which is movably housed in said container, exerts a capillary force and has a fluid path; at least one spacer which is movably housed in said container and has no fluid path; and a working fluid enclosed in said container.

A thin sheet type heat pipe according to yet another embodiment of the present invention is a thin sheet type heat pipe in which the above-mentioned at least one spacer having a fluid path comprises at least two stacked spacers which have fluid paths of same shape.

A thin sheet type heat pipe according to still yet another embodiment of the present invention is a thin sheet type heat pipe in which the above-mentioned at least one spacer having a fluid path comprises at least two stacked spacers which have fluid paths of different shape.

A thin sheet type heat pipe according to another embodiment of the present invention is a thin sheet type heat pipe in which the at least two stacked spacers are fixed to each other by sewing-up with a wire or by use of a fastening tool.

A thin sheet type heat pipe according to yet another embodiment of the present invention is a thin sheet type heat pipe in which the above-mentioned at least one spacer with no fluid path comprises stacked spacers of foil or porous sheets or stacked spacers of both of a foil sheet and a porous sheet.

A thin sheet type heat pipe according to still yet another embodiment of the present invention is a thin sheet type heat pipe in which the above-mentioned at least one spacer with no fluid path is arranged in parallel with one surface of said at least one spacer with a fluid path, when the above-mentioned at least one spacer with no fluid path comprises at least two spacers, the above-mentioned spacers with no fluid path sandwiches said at least one spacer with a fluid path, or the above-mentioned at least one spacer with no fluid path is wrapped in a spiral fashion around the above-mentioned at least one spacer with a fluid path.

A thin sheet type heat pipe according to another embodiment of the present invention is a thin sheet type heat pipe in which the above-mentioned at least one spacer having a fluid path is formed by fixing bar-shaped porous members by pressure welding, spot welding or the like.

A thin sheet type heat pipe according to yet another embodiment of the present invention is a thin sheet type heat pipe in which each of the above-mentioned bar-shaped porous members is formed by folding a mesh into at least two.

A thin sheet type heat pipe according to another embodiment of the present invention is a thin sheet type heat pipe in which a cross section of the above-mentioned fluid path has a width of from 1.5 mm to 3 mm inclusive and a height of from 0.3 mm to 1.0 mm inclusive.

A thin sheet type heat pipe according to yet another embodiment of the present invention is a thin sheet type heat pipe in which the above-mentioned at least one spacer with no fluid path has a thickness of from 0.05 mm to 0.15 mm inclusive.

BRIEF DESCRIPTION OF THE DRAWINGS

FIG. 14A is a view for illustrating another embodiment of a spacer;

FIG. 14B is a view for illustrating another embodiment of a spacer;

FIG. 15 is a cross sectional view of the spacer taken along the line A-A' of FIG. 14;

DETAILED DESCRIPTION OF THE INVENTION

Figure 1:
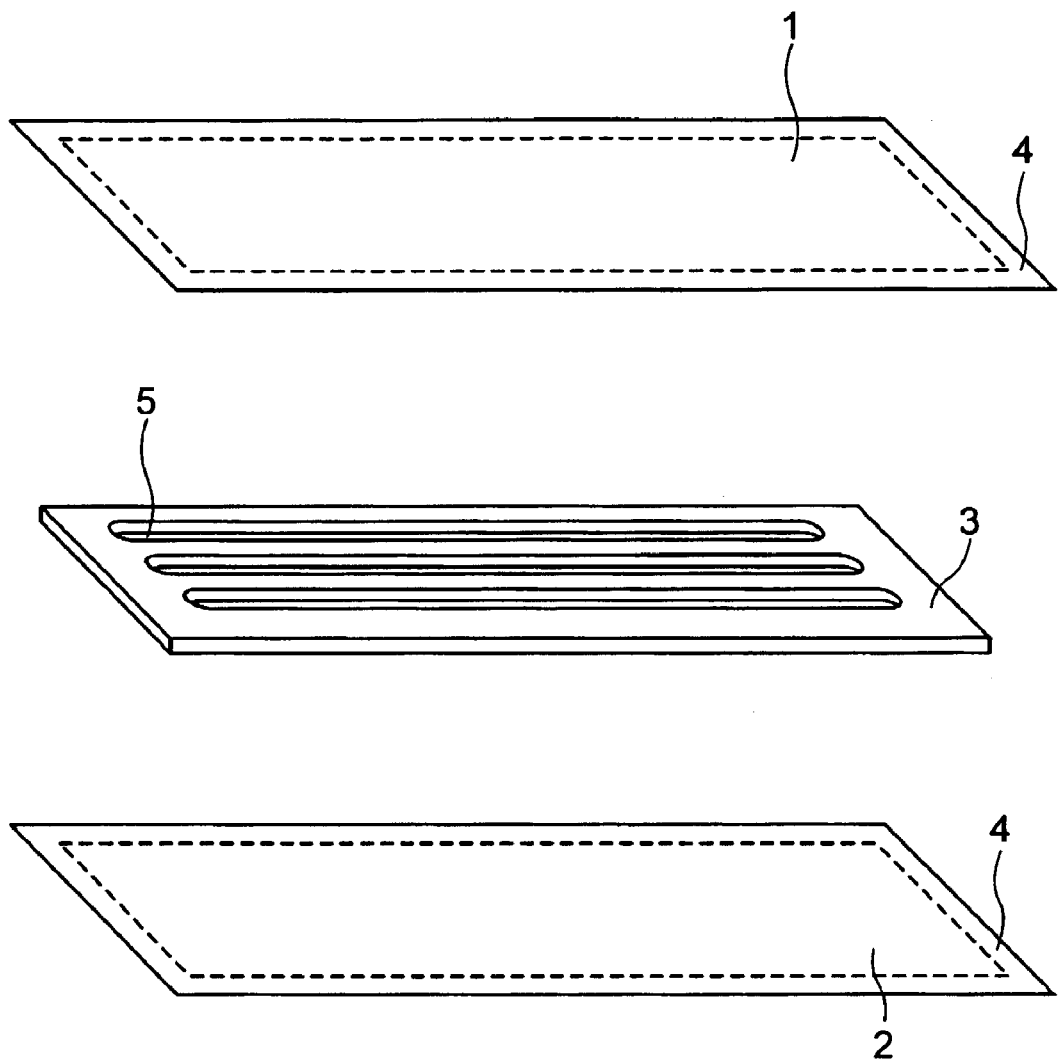
FIG. 1 is a view for illustrating a thin sheet type heat pipe according to one embodiment of the present invention.

With reference to the drawings, a thin sheet type heat pipe according to the present invention will be described in detail below.

A thin sheet type heat pipe according to the present invention is a thin sheet type heat pipe comprising: a hermetically sealed container which is formed of two foil sheets jointed at peripheral portions; at least one spacer which is movably housed in the container, exerts a capillary force and has a fluid path; and a working fluid enclosed in the container.

The above-mentioned at least one spacer comprises a first spacer which comprises a sheet having a fluid path formed in the longitudinal direction and a second spacer which comprises a sheet having a fluid path formed in the direction perpendicular to the fluid path of the first spacer, and the first spacer and the second spacer are movably arranged. Each fluid path has predetermined width, height and length, and arranged in any direction at spaced intervals. Besides, each fluid path is arranged in a parallel, meandering or radial pattern. The number of fluid paths may be one or plural.

In a thin sheet type heat pipe according to the present invention, a further spacer having no fluid path may be provided.

The at least one spacer comprises a first spacer which comprises a sheet having a fluid path formed in the longitudinal direction, a second spacer which comprises a sheet having a fluid path formed in the direction perpendicular to the fluid path of the first spacer, a spacer which has a fluid path of any shape and a third spacer which comprises a sheet having no fluid path. Among the spacers having a fluid path, at least one kind of spacer is sandwiched by two third spacers, which may be arranged movably. In addition, the first spacer, the second spacer, the spacer having a fluid path of any shape and the third spacer may be provided optionally in number and stacked in any order.

Further, at least two out of the first spacer, the second spacer and the third spacer may be successively formed to be one piece. In this case, a plurality of holes is formed between the spacers of different kind. A portion where the plurality of holes is formed is bent so as to have the first spacer, the second spacer or the third spacer stacked.

As mentioned above, in order to achieve flexibility, a container is formed with a metal foil or the like which is thin enough to be bent. A container formed by jointing metal foils by seam welding, brazing and soldering or the like can achieve a high long-term reliability. Generally, a resin has been thought to lack in reliability in respect to permeability, gas generation or the like. However, as a composite material such as a resin/clay at a nanocomposite level or a resin/metal sometimes exhibits significantly improved characteristic as compared with a conventional resin, and such a composite material may be utilized.

When a thin soft container is used, a fluid path of the container as it stands is blocked by ambient pressure. For this reason, a spacer is provided inserted therein. The spacer is formed by use of a metal foil of which the thickness is equal to or more than that of the container. The metal foil is subjected to cutting, punching press, etching or another appropriate method to form a long hole. The metal foil with a thus formed hole is housed in the container in such a manner that it is not fixed therein. Consequently, when the container is bent, there occurs a displacement between the container and the spacer and therefore, it can be bent without causing crush bending.

Used as a spacer may be a sheet having capillary force, such as a sheet-type netting, a sheet-type sintered metal and a nonwoven cloth. Further, a sheet type member having a fluid path may be formed by dividing such a sheet with capillary force into plural portions of predetermined shape, arranging them at spaced intervals, in a parallel, meandering, radial, crossed or another predetermined pattern, jointing overlapped portions of them partially by pressure welding, spot welding, wire sewing, putting together by way of a stapler or another fastening tool or another appropriate method. Furthermore, a sheet type member may be formed by a combination of rolled-up or bent meshes. Or, sheet type meshes are stacked and fastened together by such a method as mentioned above, then to form communicating holes of the respective meshes by one punching press or the like.

In a thin sheet type heat pipe according to the present invention, since the flow resistance of steam is less for providing a small number of large fluid paths than for providing a large number of narrow fluid paths, heat transport capacity generally becomes larger although the cross section area of slits is the same. When conventional wires are equally spaced to be used as a spacer, there is a drawback such that spaces are apt to go out of order and adequate fluid paths can not be formed equally. However, the distance between fluid paths can be kept equal by using a spacer formed of a metal foil with slits. Further, a spacer having slits formed in the longitudinal direction and a spacer having slits in the crosswise direction are stacked to have the long holes connected spatially so as to accelerate planar even heating. In this way, by inserting foils with slits in a container, the number of members can be reduced, the spaced intervals between the slits can be prevented from going out of order even bending the container and it is easy to assure evenly formed fluid path. Since a material other than metal is not inserted into the container, noncondensable gas can not be generated.

Arranged between a spacer and a container as a cover may be a relatively hard foil which has no slit formed. With this arrangement, a foil of the container can be prevented from being pressed by the ambient pressure into a slit of the spacer. Since the above-described foil arranged between the spacer and the container is also not fixed to the container, the container can be bent with the foil left sliding on the container and not crushed. Further, the flatness of the heat transfer contact surface is improved, thereby enhancing heat transfer efficiency. One of foils arranged between the spacer and the container is formed of a relatively hard and thick foil while the other foil is formed of a relatively thin and soft foil. According to this embodiment, it is possible to provide a flexible container but to prevent at least one foil of the container from being pressed into a fluid path, thereby improving the flatness.

Furthermore, a wick-integrated spacer may be utilized which is formed by using a foil with slits as a core and wrapping a mesh around the foil. In this embodiment, it is possible to assure a capillary force for circulation of a working fluid and to increase stiffness of the spacer for ready maintenance of its shape. Besides, since the cross section of a fluid path can be made larger by the mesh, the height of the fluid path can be assured. Further, for example, a foil sintered with a copper powder or a mesh on, a foil and mesh partially jointed by spot welding, seam welding or the like or a thick mesh having a certain degree of thickness such as a tatami mesh may be provided with slits to be used as a spacer. When such a spacer is used, an even fluid path can be assured while it is possible to reduce thickness and the number of members.

Regarding a foil arranged between a spacer and a container to be used as a cover, a surface of the foil may be made rough. For example, when the cover surface is made even and fine like a rough face of electrolytic copper foil, it becomes easy to spread wetting by a working fluid, thereby preventing the working fluid from accumulating in a condensation portion to block fluid paths. Besides, passage of a working fluid between a cover and a wick can be facilitated, which can smooth circulation of the liquid. Roughening of a cover may be performed by use of a physical method of sand paper, sand blasting or wet blasting or a method of acid cleaning, high-temperature oxidation or the like. Then, a relatively hard foil for pressure used as a cover and a sheet for improving wettability, for example a mesh or sintered powder metal sheet may be stacked.

A spacer may be formed by folding a foil in plural. As such a spacer is formed by, for example, folding one member back for even heating to stack a spacer with fluid paths formed in the longitudinal direction on a spacer with fluid paths formed in the crosswise direction and vice versa, the number of members can be reduced. Although there is a possibility that in a deaeration step, noncondensable gas accumulates in a folded portion, a hole may be formed in the folded portion to facilitate deaeration. A foil to be used as a cover may be cut at a predetermined portion or divided to be aligned so as to have a hinge-like portion, thereby to facilitate bending. Further, a foil to be used as a cover may be prepared partially or fully in a flat spiral fashion and then, wrapped around a spacer with fluid paths, thereby also to facilitate bending.

In using, transporting or the like of a thin sheet type heat pipe, when the temperature is equal to or less than 100° C., the shape is kept as it stands by a spacer. When the temperature is more than 100° C., it may be expanded and greatly deformed by steam pressure. Then, upper and lower foils which consist in a container are partially jointed by an appropriate method of spot welding or the like. If a container and a spacer are integrally jointed, a jointed portion becomes thicker and the difference of curvature radius is larger with a result of loss in flexibility. If large holes are formed in a spacer and the foils of the container are jointed in such a manner that the jointed portion is not in contact with the spacer inside the holes, the difference of the curvature radius at the jointed portion becomes narrow, and the spacer and the container can be displaced, thereby keeping the container flexible.

As an example, a container is formed of a copper foil which is 30 μm to 50 μm in thickness. A spacer is formed of a sheet-type woven metal member which is 300 μm to 600 μm in thickness and has fluid paths each of 2 mm to 3 mm width, and a spacer is formed of a copper foil which is 50 μm to 100 μm in thickness and has a surface roughened by shotblasting and no fluid path. A spacer with fluid paths is sandwiched by spacers with no fluid path, which are all inserted into a container. Then, a part of the periphery of the container is left as an opening for sealing, and the remaining part is jointed by seam welding, ultrasonic welding, brazing or the like. This is followed by filling water via the opening into the container, then the container is subjected to deaeration by an appropriate method such as vacuum deaeration or thermal deaeration. After that, the opening is closed to form an heat pipe, thereby obtaining an excellent heat transferability.

When the thickness of a spacer having fluid paths becomes equal to or less than 300 μm, pressure loss in the steam phase is significantly increased irrespective of the width of each fluid path, resulting in significant decrease of heat transferability. For this reason, it is preferable that the spacer with fluid paths is practically equal to or more than about 300 μm, In addition, in order to prevent a fluid path with the width of 2 mm from being crushed by atmospheric pressure, for example, when a material of C1020-H is used as a pressure-resistant cover, its thickness is preferably equal to or more than about 50 μm.

Preferably, the cross section of such a fluid path as described above has the width of from 1.5 mm to 3 mm inclusive and the height of from 0.3 mm to 1.0 mm inclusive. Further, a spacer with no fluid path preferably has the thickness of from 0.05 mm to 0.15 mm inclusive.

Figure 12:
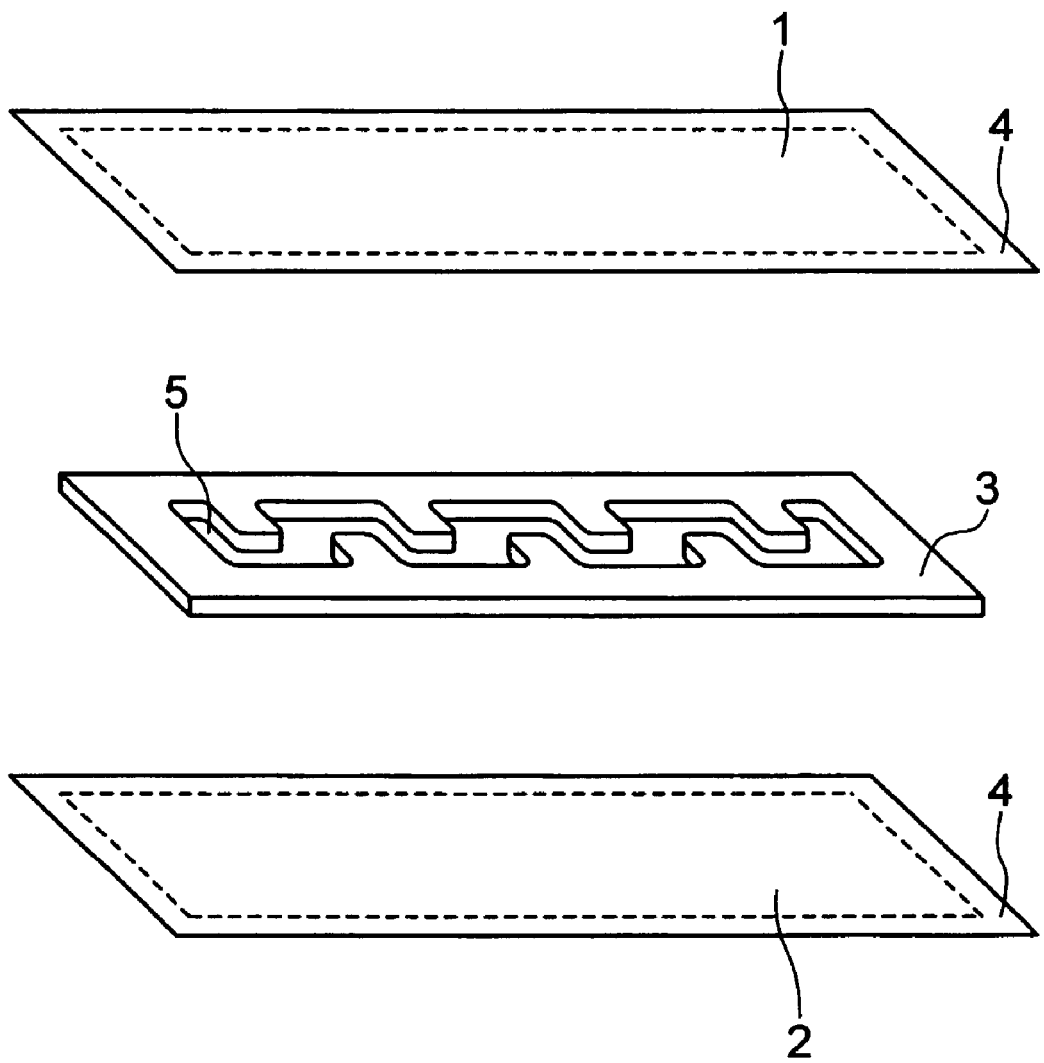
FIG. 12 is a view for illustrating a thin sheet type heat pipe according to yet another embodiment of the present invention.
Figure 13:
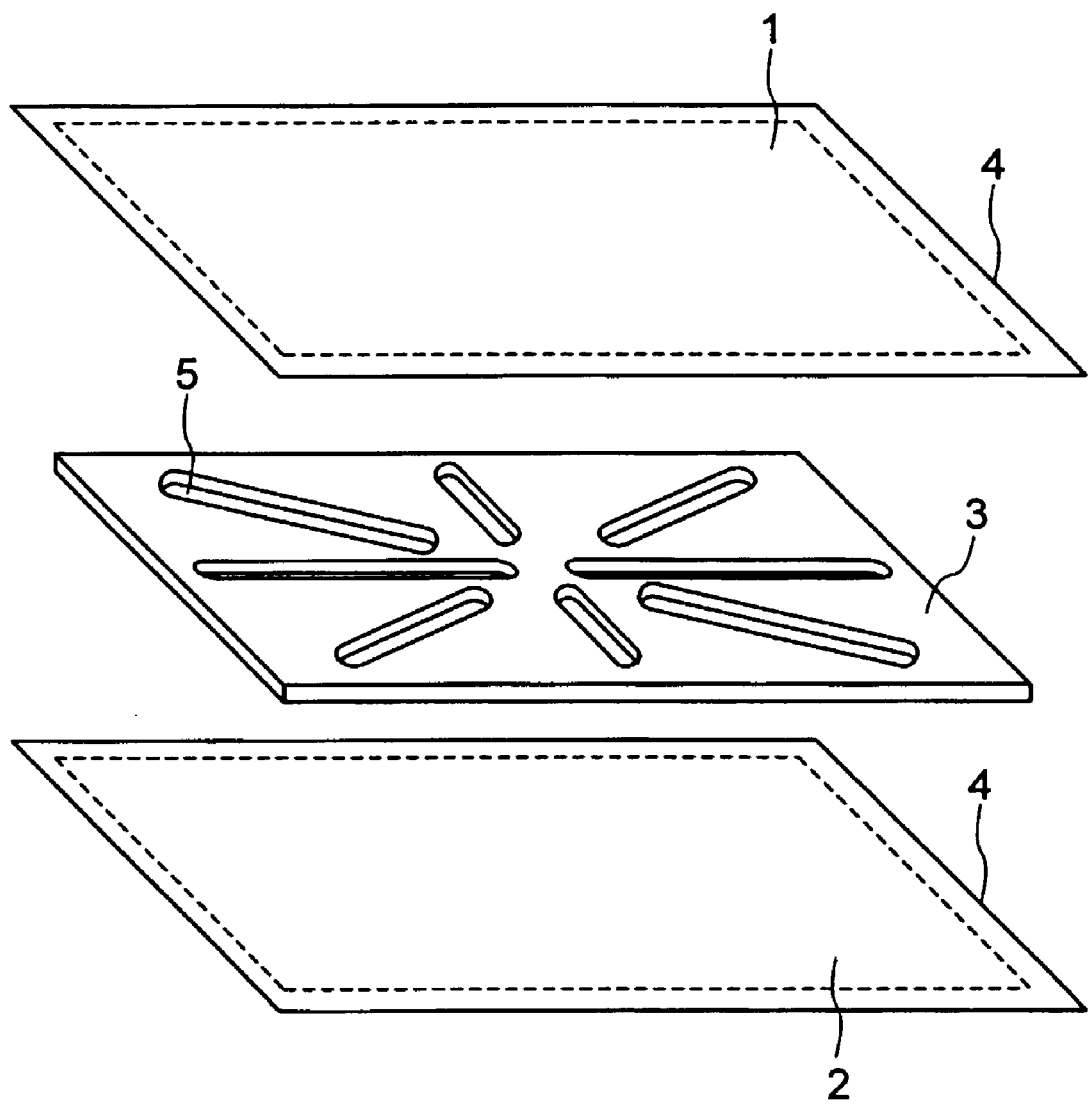
FIG. 13 is a view for illustrating a thin sheet type heat pipe according to still yet another embodiment of the present invention.

FIG. 1 is a view for explaining one embodiment of a thin sheet type heat pipe according to the present invention. As shown in FIG. 1, a thin sheet type heat pipe comprises: a hermetically sealed container which is formed of two foil sheets 1 and 2 jointed at peripheral portions 4; one spacer 3 which is movably housed in the container, exerts a capillary force and has fluid paths 5; and a working fluid enclosed in the container. The above-mentioned spacer 3 comprises one sheet member in which the plural fluid paths 5 are formed in parallel in the longitudinal direction of the sheet member As shown in FIG. 12, the spacer 3 may comprises a curved (meandering) fluid path 5. Further, as shown in FIG. 13, the spacer 3 may comprise a plurality of fluid paths 5 extending from the center to ends in a radial direction.

In order to further increase the capillary force, the spacer 3 with fluid paths may be provided with a groove formed therein or may be rough on the surface. Besides, the spacer 3 may be formed of a sheet having a capillary force for example, a mesh, a sintered metal sheet.

Figure 2:
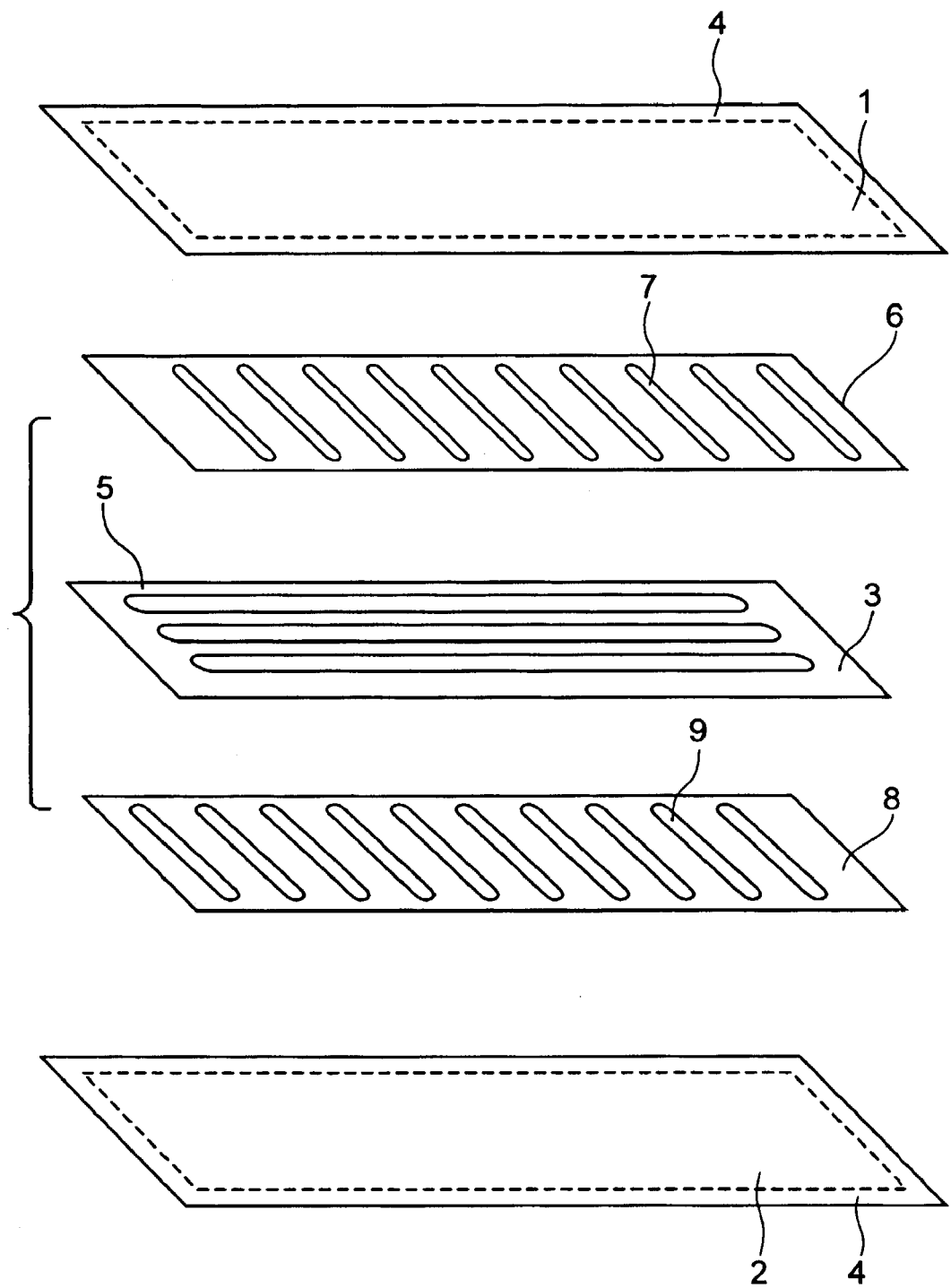
FIG. 2 is a view for illustrating a thin sheet type heat pipe according to another embodiment of the present invention.

FIG. 2 is a view for explaining another embodiment of a thin sheet type heat pipe according to the present invention. As shown in FIG. 2, a thin sheet type heat pipe of this embodiment comprises: a hermetically sealed container which is formed of two foil sheets 1 and 2 jointed at peripheral portions 4; three spacers 3 which are movably housed in the container and have fluid paths 5 to exert a capillary force; and a working fluid enclosed in the container. The above-mentioned spacers comprises a first spacer 3 which has plural fluid paths 5 formed in parallel in the longitudinal direction and second spacers 6 and 8 which have plural fluid paths 7 and 9, respectively, formed in the direction perpendicular to the fluid paths of the first spacer. The first spacer 3 is sandwiched by the two second spacers 6 and 8, which are all movably arranged.

As mentioned above, the spacers of this embodiment are combination of a spacer having slits (fluid paths) formed in the longitudinal direction and spacers having slits (fluid paths) formed in the crosswise direction, which spacers are all movably arranged in the container. With such a combination, the slits formed in the longitudinal direction and the slits formed in the crosswise direction are spatially connected to each other thereby to enhance planar even heating. Further, the shape of each slit may be changed at appropriate thereby to obtain thin sheet type heat pipes of various shapes.

Figure 3:
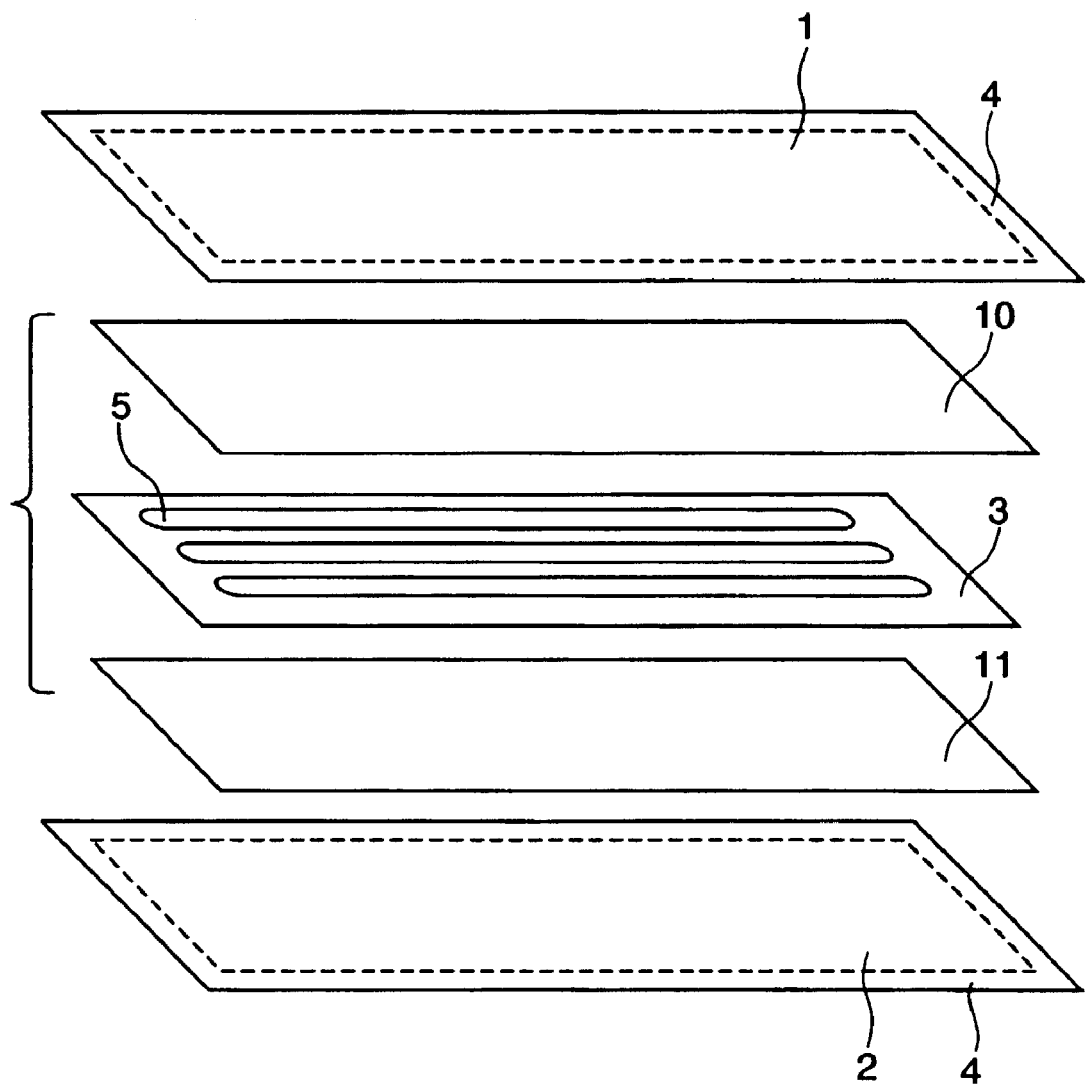
FIG. 3 is a view for illustrating a thin sheet type heat pipe according to yet another embodiment of the present invention.

FIG. 3 is a view for explaining yet another embodiment of a thin sheet type heat pipe according to the present invention. As shown in FIG. 3, a thin sheet type heat pipe of this embodiment comprises: a hermetically sealed container which is formed of two foil sheets 1 and 2 jointed at peripheral portions 4; one spacer which is movably housed in the container, exerts a capillary force and has fluid paths; two spacers which have no fluid path; and a working fluid enclosed in the container. The above-mentioned spacers comprise a first spacer 3 which has plural fluid paths 5 formed parallel in the longitudinal direction and third spacers 10 and 11 which have no fluid path. The first spacer 3 is sandwiched by the two third spacers 10 and 11, which are all movably arranged.

As mentioned above, the spacers of this embodiment are combination of a spacer having slits (fluid paths) formed therein and spacers having no slit (fluid path) (such spacers are also referred to as "covers"). The foils which consist in the container are required to be thin and soft so as to have flexibility. When the width of each slit (fluid path) is formed large, the foils of the container are deformed by negative pressure to be possibly pressed into the slits. Then, a relatively hard foil having no slit (fluid path) is inserted as a cover between the spacer and the container. With this configuration, the foils of the container are prevented from being pressed into slits of the spacer, thereby assuring adequate fluid paths, and the flatness of a contact surface is improved, thereby allowing the heat transfer efficiency to be enhanced. Since the covers are arranged movably relative to the container and the spacer with fluid paths, they can be displaced relative to the container and the spacer, which allows smooth bending without crushing.

Figure 4:
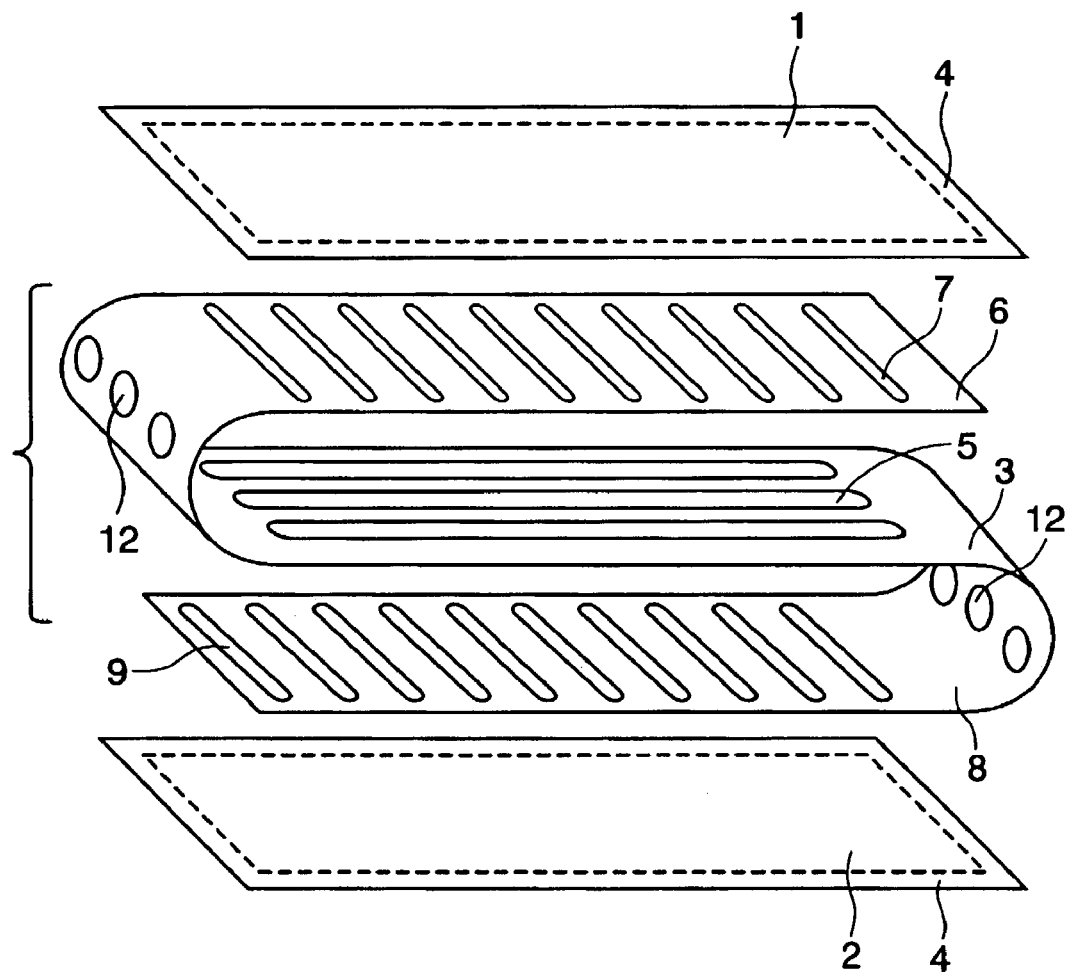
FIG. 4 is a view for illustrating a thin sheet type heat pipe according to still yet another embodiment of the present invention.

FIG. 4 is a view for explaining still yet another embodiment of a thin sheet type heat pipe according to the present invention. As shown in FIG. 4, a thin sheet type heat pipe of this embodiment comprises: a hermetically sealed container which is formed of two foil sheets 1 and 2 jointed at peripheral portions 4; one-piece spacers formed by folding in three, which are movably housed in the container and have fluid paths to exert a capillary force; and a working fluid enclosed in the container.

The above-mentioned one-piece spacers are of the above-mentioned second spacer, first spacer and second spacer formed in this order. A plurality of holes is formed between the second spacer and the first spacer and also between the first spacer and the last second spacer. Portions where the holes are formed are folded, resulting in that the first spacer is sandwiched by the two second spacers. Thus formed one-piece spacers are movably arranged in the container.

As mentioned above, the one-piece spacers of this embodiment are integrally formed of a portion having longitudinal slits (fluid paths) and portions having crosswise slits (fluid paths). Since these three spacers are formed by folding one member, it is possible to reduce the number of members while achieving the same effects as those seen in the embodiment on FIG. 2. Since noncondensable gas is apt to accumulate in the folded portions of the one-piece spacers, the plurality of holes are formed in advance in the folded portions so as to facilitate deaeration.

Figure 5:
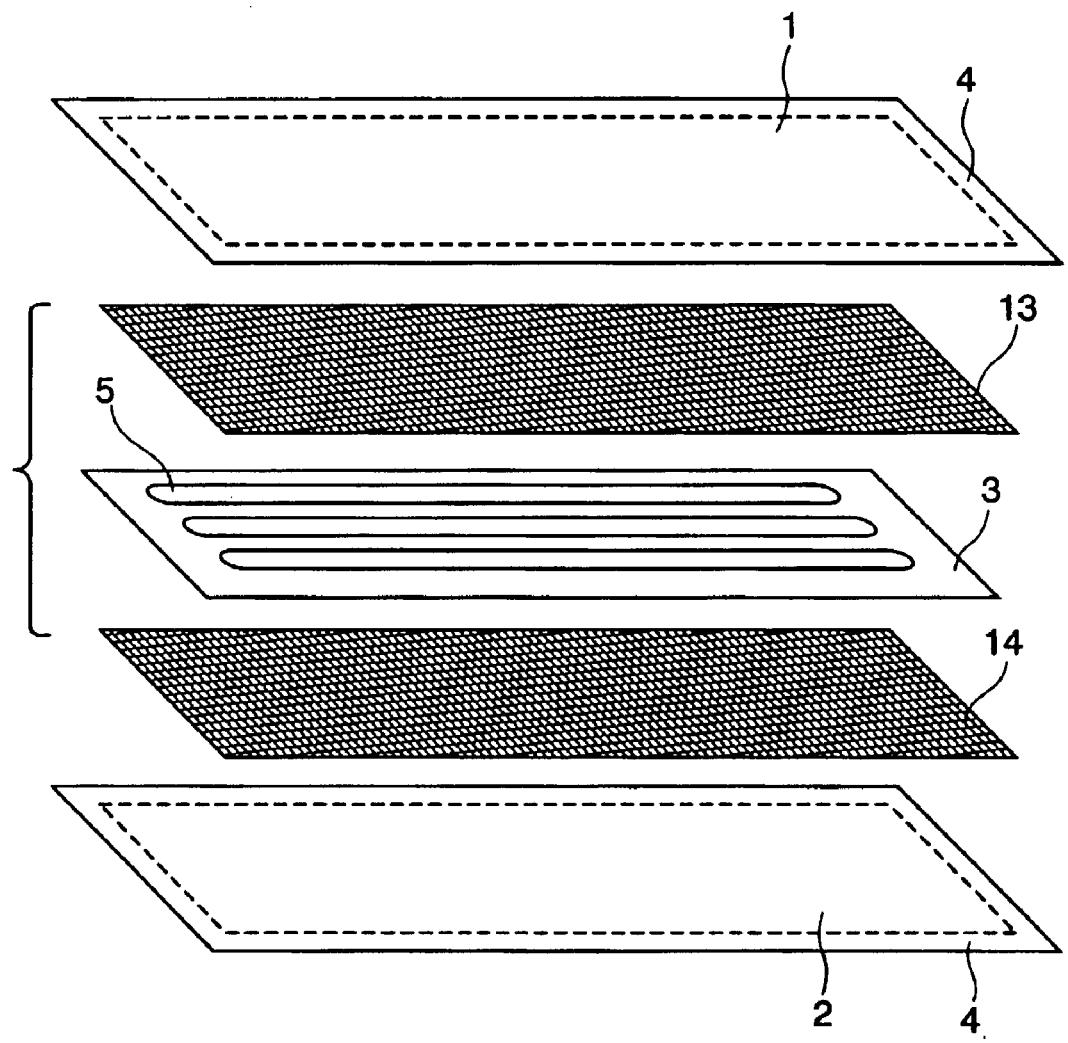
FIG. 5 is a view for illustrating a thin sheet type heat pipe according to another embodiment of the present invention.

FIG. 5 is a view for explaining another embodiment of a thin sheet type heat pipe according to the present invention. As shown in FIG. 5, a thin sheet type heat pipe of this embodiment comprises: a hermetically sealed container which is formed of two foil sheets 1 and 2 jointed at peripheral portions 4; one spacer which is movably arranged in the container and has fluid paths to exert a capillary force; two sheet type spacers, for example meshes or sintered metal sheets, each having a capillary force; and a working fluid enclosed in the container.

The above-mentioned spacers comprise a first spacer 3 which has a plurality of fluid paths 5 formed in parallel and in the longitudinal direction and two spacers 13 and 14 which comprise sheets having a capillary force. The first spacer 3 is sandwiched by the two spacers 13 and 14 which are sheets having capillary forces, and these spacers are all movably arranged in the container.

As mentioned above, the spacers of this embodiment are provided such that the two sheets with capillary forces 13 and 14 are arranged at both sides of the spacer 3 having fluid paths 5 formed in the longitudinal direction. With this configuration, it is possible to increase the capillary forces of the spacers. If one mesh is used to wrap plural spacers as a whole, the spacers are prevented from coming apart. In addition, relatively hard foils are further stacked to sandwich the sheets with capillary forces as covers.

Figure 6:
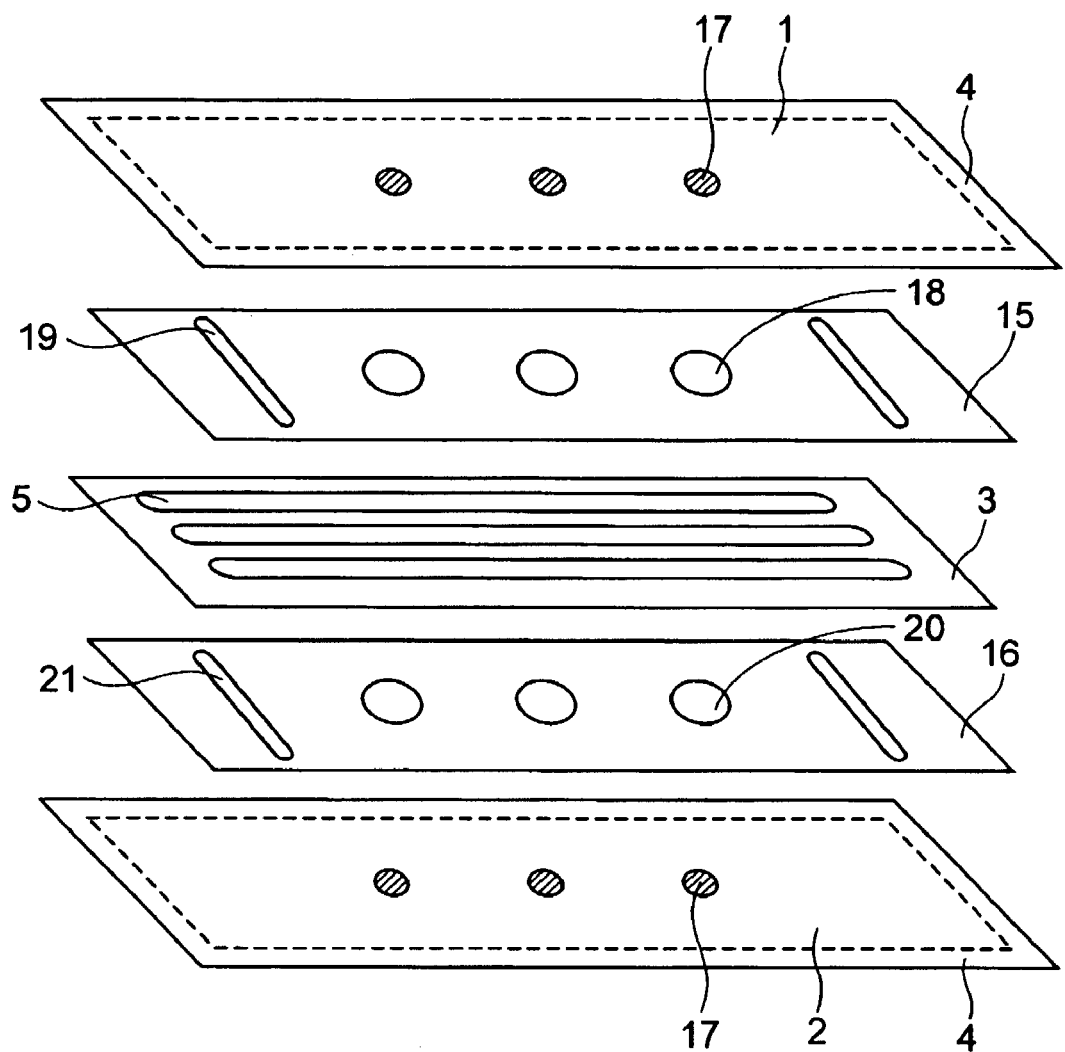
FIG. 6 is a view for illustrating a thin sheet type heat pipe according to yet another embodiment of the present invention.

FIG. 6 is a view for explaining yet another embodiment of a thin sheet type heat pipe according to the present invention. As shown in FIG. 6, a thin sheet type heat pipe of this embodiment comprises: a hermetically sealed container which is formed of two foil sheets 1 and 2 jointed at peripheral portions 4 and is subjected to spot welding at predetermined positions; one spacer which is movably arranged in the container and has fluid paths to exert a capillary force; two spacers having communicating paths at end portions and holes at positions corresponding to the portions of the spot welding; and a working fluid enclosed in the container.

The above-mentioned spacers comprise a first spacer 3 which has a plurality of fluid paths 5 formed in parallel and in the longitudinal direction and two fourth spacers 15 and 16 which comprise sheets having communicating paths 19 and 21, respectively, at portions corresponding to the end portions of the fluid paths 5 and plural holes 18 and 20, respectively, at predetermined positions in the center. The first spacer 3 is sandwiched by the two fourth spacers 15 and 16. Positions in the two foil sheets 1 and 2 which consist in the container, corresponding to the plural holes 18 and 20, respectively, are further welded by spot welding. The spacers are all movably arranged in the container.

As mentioned above, in this embodiment, spots on foils of the container are welded by spot welding. It is only the foils of the container that are fixed by spot welding, while the spacers arranged in the container are away from spot welding with use of the holes to be movable in the container. A heat pipe of this embodiment, it is possible to obtain desired resistance to pressure, without losing flexibility.

Figure 7:
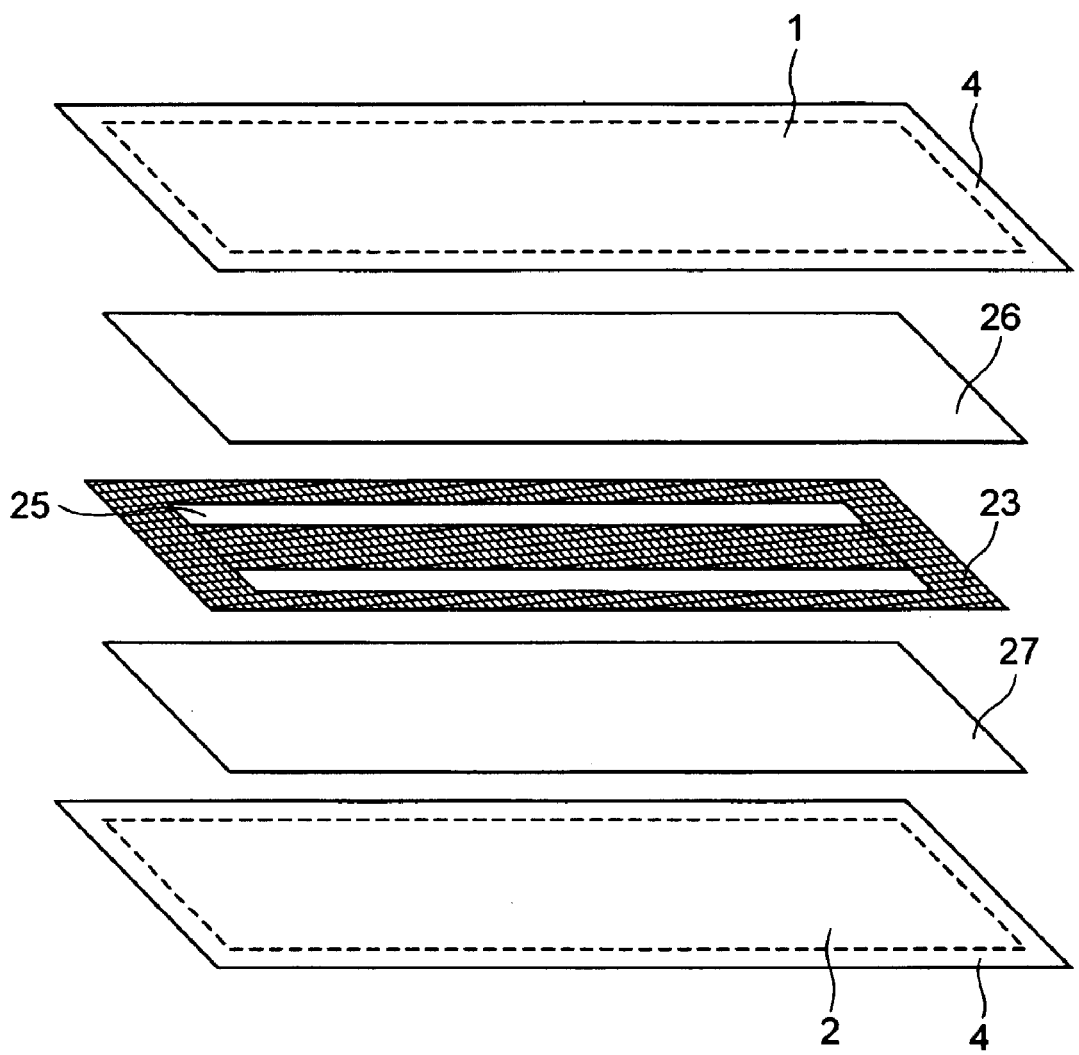
FIG. 7 is a view for illustrating a thin sheet type heat pipe according to still yet another embodiment of the present invention.

FIG. 7 is a view for explaining still yet another embodiment of a thin sheet type heat pipe according to the present invention. As shown in FIG. 7, a thin sheet type heat pipe of this embodiment comprises: a hermetically sealed container which is formed of two foil sheets 1 and 2 jointed at peripheral portions 4; one spacer formed by wrapping a mesh around a sheet with fluid paths, which spacer being movably arranged in the container; two spacers having no fluid path; and a working fluid enclosed in the container.

The above-mentioned spacers comprise a first spacer 23 which is formed by wrapping a mesh around a sheet having a plurality of fluid paths 25 formed in parallel and in the longitudinal direction and third spacers 26 and 27 which are sheets having no fluid path. The first spacer 23 is sandwiched by the two third spacers 26 and 27, which are all movably arranged in the container.

As mentioned above, a spacer of this embodiment is a mesh integrated spacer formed by fitting meshes to a spacer and partially jointing them by spot welding or the like, or by wrapping a mesh around a spacer. By using such a spacer, it becomes possible to obtain a spacer which is ultrathin but has fluid paths formed therein to achieve a large capillary force. Besides, only with meshes inserted, there may cause variations in space between the meshes, resulting in blocking a fluid path. However, by combining a spacer of foil and a spacer wrapped in a mesh, the space between meshes can be kept fixed.

In addition, a single layer mesh is apt to be contorted due to insufficient strength. However, the strength of the mesh can be increased by, for example, rolling up meshes by a predetermined width and arranging them appropriately, and then, fixing overlapped portions of the mesh by pressure welding, thereby preventing distortion from occurring in the mesh. Further, by sewing up overlapped meshes by a wire or by use of a fastening tool, the meshes can be fixed not to be misaligned without crushing cells of the meshes.

Figure 16:
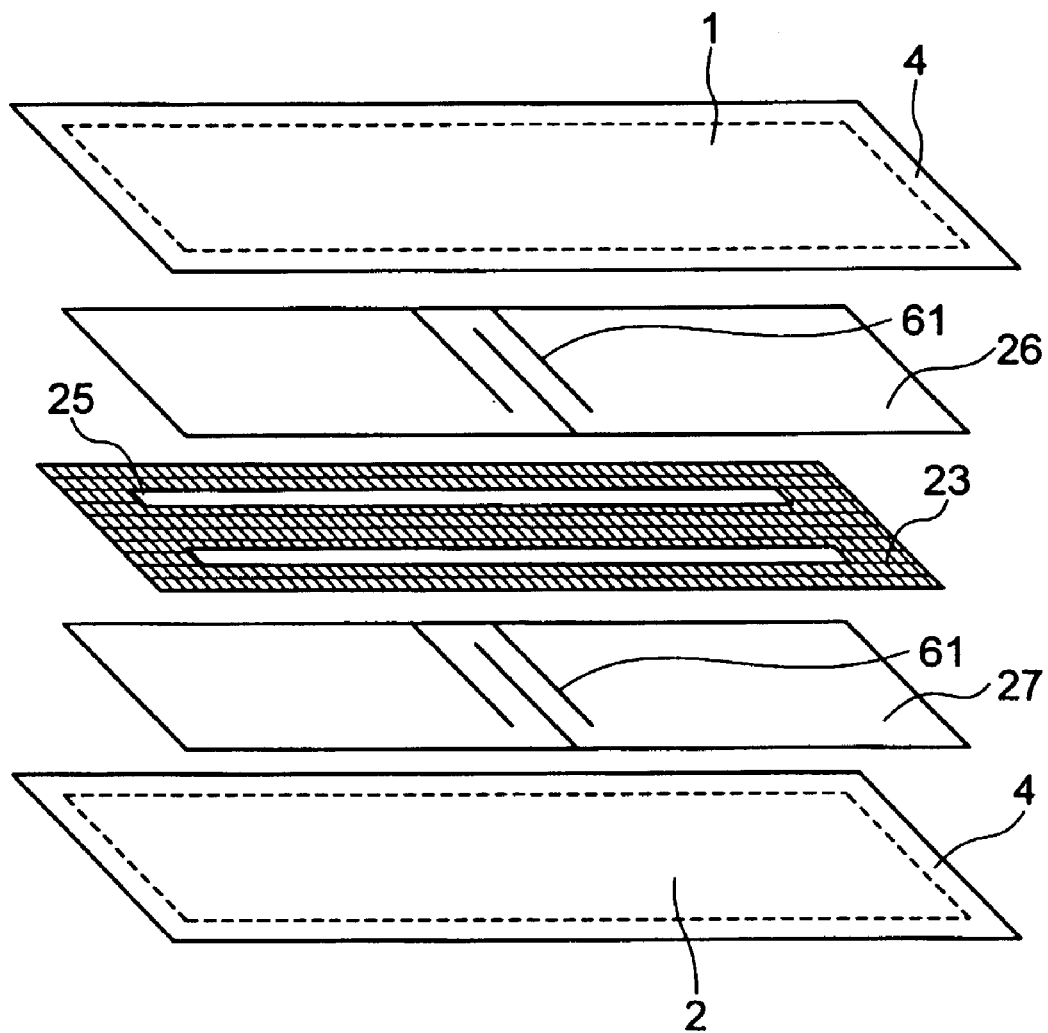
FIG. 16 is a view for illustrating a thin sheet type heat pipe according to another embodiment of the present invention.

FIG. 16 is a view for showing another embodiment of a thin sheet type heat pipe according to the present invention. The thin sheet type heat pipe of this embodiment is formed by adding given cuts 61 to third spaces 26 and 27 which are sheets with no fluid path in a thin sheet type heat pipe of the embodiment on FIG. 7. With thus provided cuts, bending can be absorbed to facilitate bending of the thin sheet type heat pipe. Where required, (although it is not shown), each of the third spacers 26 and 27 may be divided into two (separated from each other) at a given position. This division into two further facilitates bending of the heat pipe, and, for example, a thin sheet type heat pipe may be bent approximately at the right angle. Accordingly, the range of uses is increased.

Figure 18:
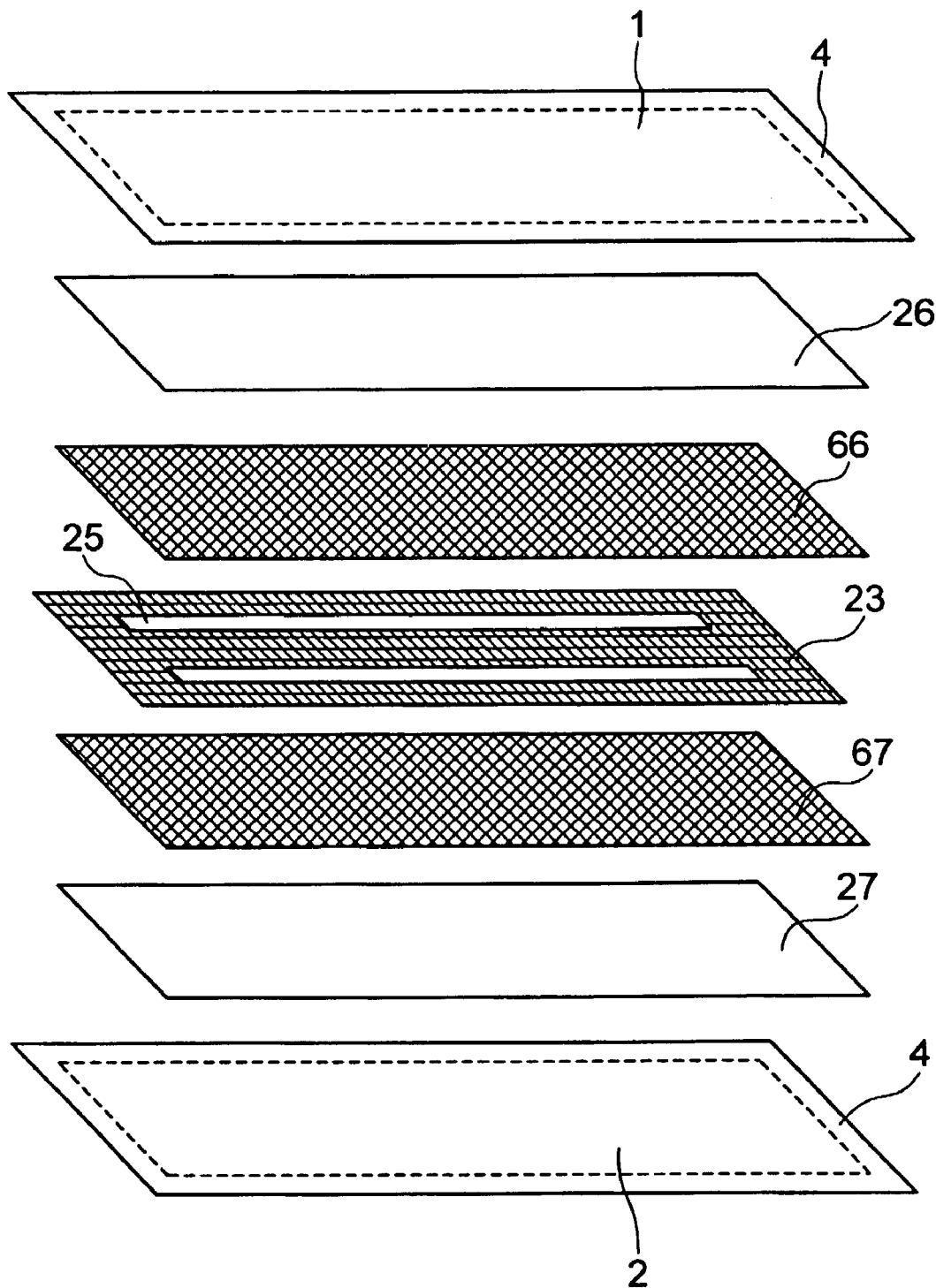
FIG. 18 is a view for illustrating a thin sheet type heat pipe according to still yet another embodiment of the present invention.

FIG. 18 is a view for showing yet another embodiment of a thin sheet type heat pipe according to the present invention. The thin sheet type heat pipe of this embodiment is formed by arranging mesh sheets or sintered powder metal sheets 66 and 67 between the first spacer 23, which is a sheet with fluid paths wrapped in a mesh, and the third spacer 26 with no fluid path and between the first spacer 23 and the third spacer 27 with no fluid path, respectively. As the mesh sheets or sintered powder metal sheets 66 and 67 between the one spacer 23, which is formed by wrapping a mesh around a sheet having fluid paths, and the third spacers 26 and 17, respectively, which has no fluid path, wettability can be improved.

Figure 8:
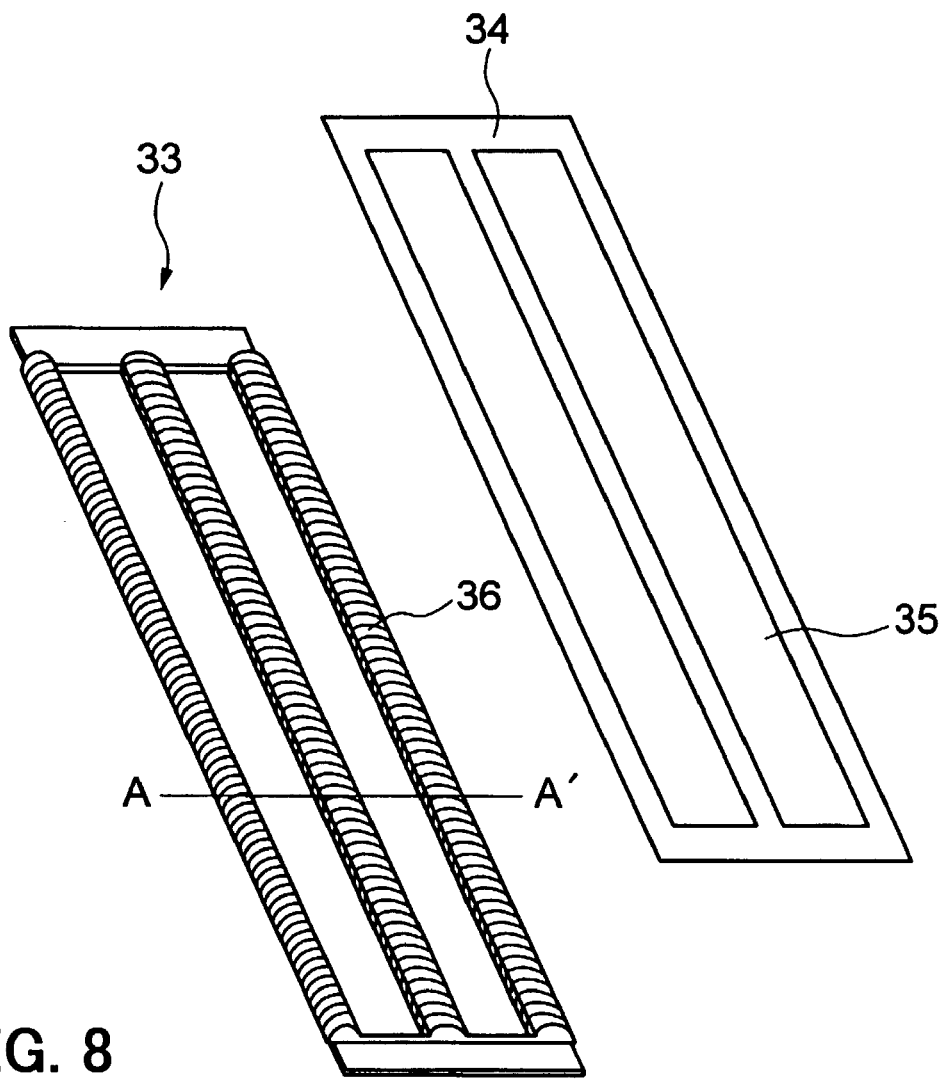
FIG. 8 is a view for illustrating another embodiment of a spacer.
Figure 9:
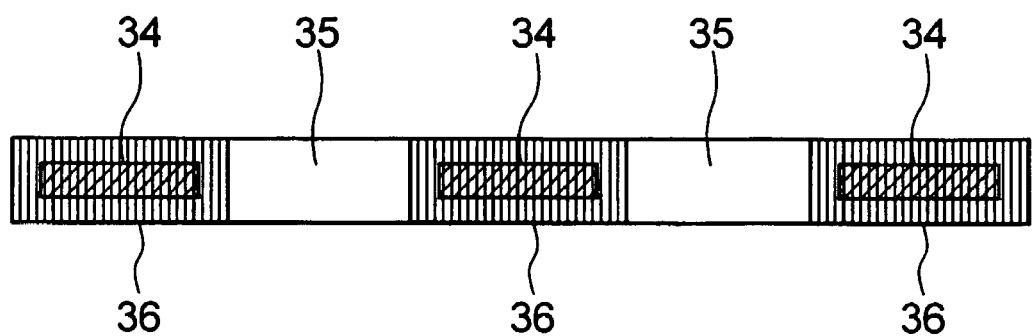
FIG. 9 is a cross sectional view of the spacer taken along the line A-A' of FIG. 8.

FIG. 8 is a view for illustrating another embodiment of a spacer. FIG. 9 is a cross sectional view of the spacer taken along the line A-A' of FIG. 8. The spacer according to the embodiment on FIG. 8 is a mesh-integrated spacer. As shown in FIG. 8, the mesh-integrated spacer is formed by preparing a foil 34 as a spacer which has slits (fluid paths) 35 as a core and wrapping a mesh with cuts around the spacer. As shown in FIG. 9, the spacer is formed such that each mesh 36 is wrapped around a foil 34 as a core. A portion of which a core is wrapped in a mesh is formed at the both sides and the center of the spacer. Formed between mesh-wrapped portions are fluid paths 35. One of forming methods is of sandwiching a foil between meshes to partially fix them by spot welding or the like before, while the meshes and the foil are in layers, punching them by punching press.

FIG. 14 is a view for illustrating another embodiment of a spacer. FIG. 15 is a cross sectional view of the spacer taken along the line A-A' of FIG. 14. The spacer of the embodiment shown in FIG. 14 is formed by arranging in parallel three long-bar wicks 36 each of which is formed wrapped in a mesh and then, arranging bar wicks 33 at the both ends of the long bar wicks 36, which is shown in FIG. 14A. Then, as shown in FIG. 14B, the bar wicks 33 and the long bar wicks 36 are fastened to each other by spot welding. Formed between thus arranged long bar wicks 36 and the bar wicks 33 are fluid paths 35. The long bar wicks 36 are each formed by being wrapped in a mesh and pressed from the both surfaces.

Figure 19A:
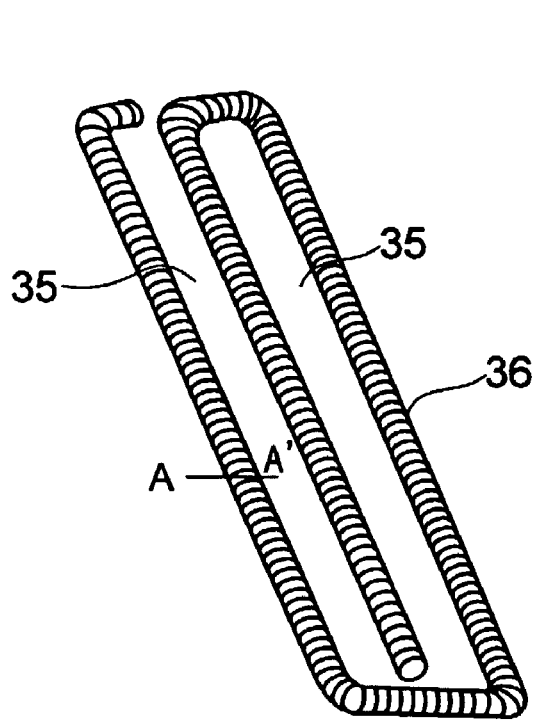
FIG. 19A is a view for illustrating another embodiment of a spacer.
Figure 19B:
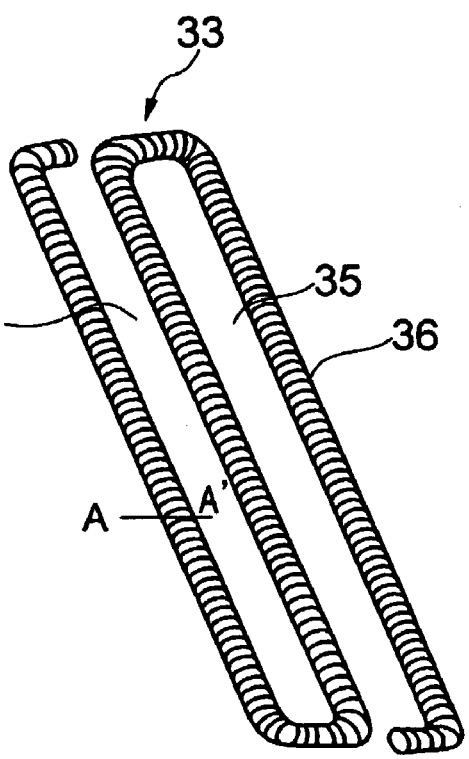
FIG. 19B is a view for illustrating another embodiment of a spacer.
Figure 20A:
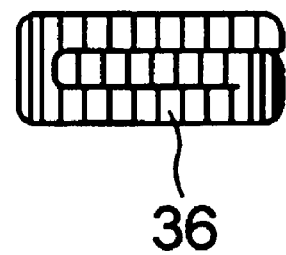
FIG. 20A is a cross sectional view of the spacer taken along the line A-A' of FIG. 19A.
Figure 20B:
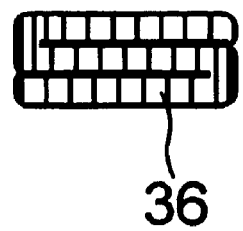
FIG. 20B is a cross sectional view of the spacer taken along the line A-A' of FIG. 19B.

FIG. 19A and FIG. 19B are views each for illustrating yet another embodiment of a spacer. FIG. 20A and FIG. 20B are cross sectional views each of the spacer taken along the line A-A' of FIG. 19A and FIG. 19B, respectively. As shown in FIG. 19A, a spacer of this embodiment is formed by bending one long bar wick 36 which is wrapped in a mesh, in such a manner that three portions of the wick are paralleled. Formed between thus arranged portions of the long bar wick are fluid paths 35. As shown in FIGS. 20A and 20B, a long bar wick 36 is formed by winding a mesh in a unique direction and pressing the mesh from the both surfaces (see FIG. 20A), or by folding a mesh to have three portions superimposed one on another and pressing the mesh from the both surfaces (see FIG. 20B).

Figure 10:
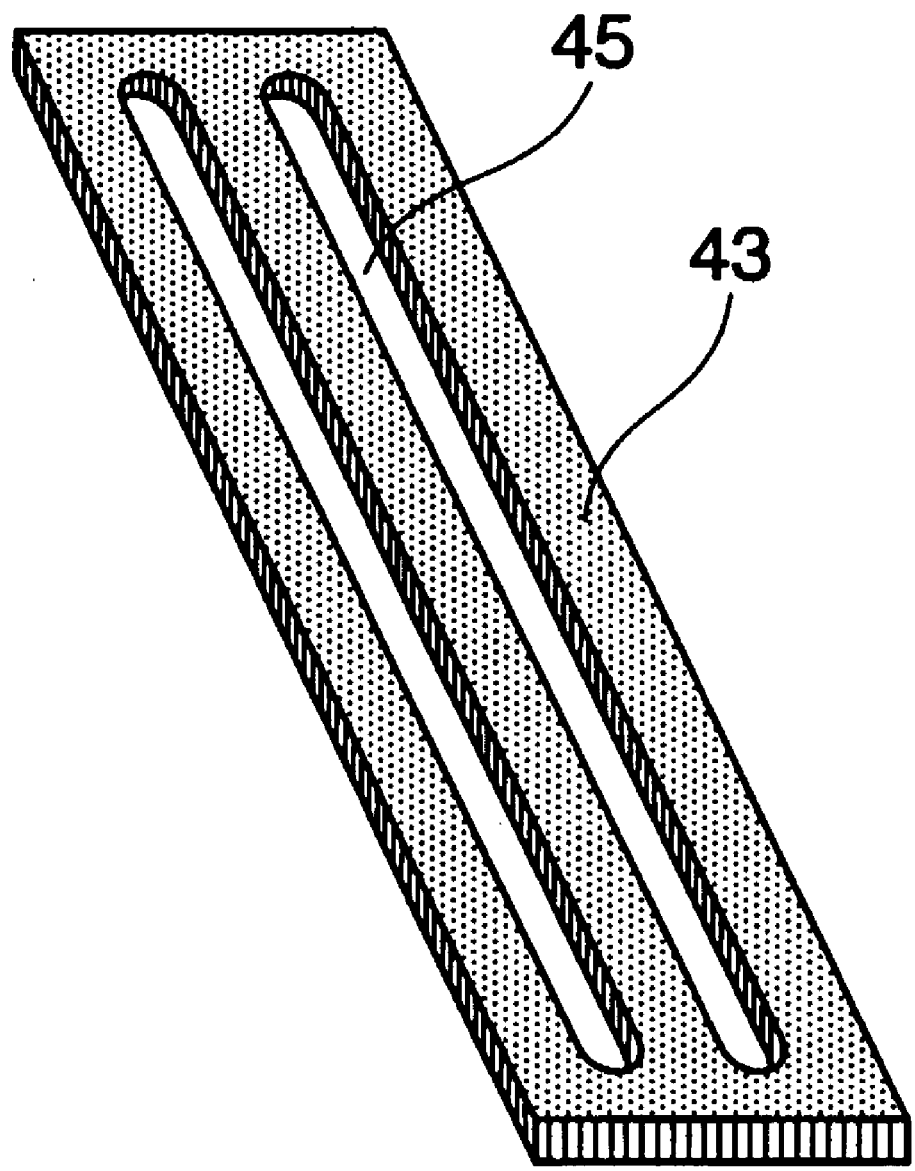
FIG. 10 is a view for illustrating yet another embodiment of a spacer.

FIG. 10 is a view for illustrating still yet another embodiment of a spacer. As shown in FIG. 10, a spacer of this embodiment is formed by providing a tatami mesh with slits (fluid paths). Since a tatami mesh is generally thicker than a plain mesh, it can has the function of a spacer as it is. Besides, since the spacer is fine, it is impervious to lose its shape and has a large capillary force. By using such a tatami mesh as a spacer, it becomes possible to reduce the number of members.

Figure 11:
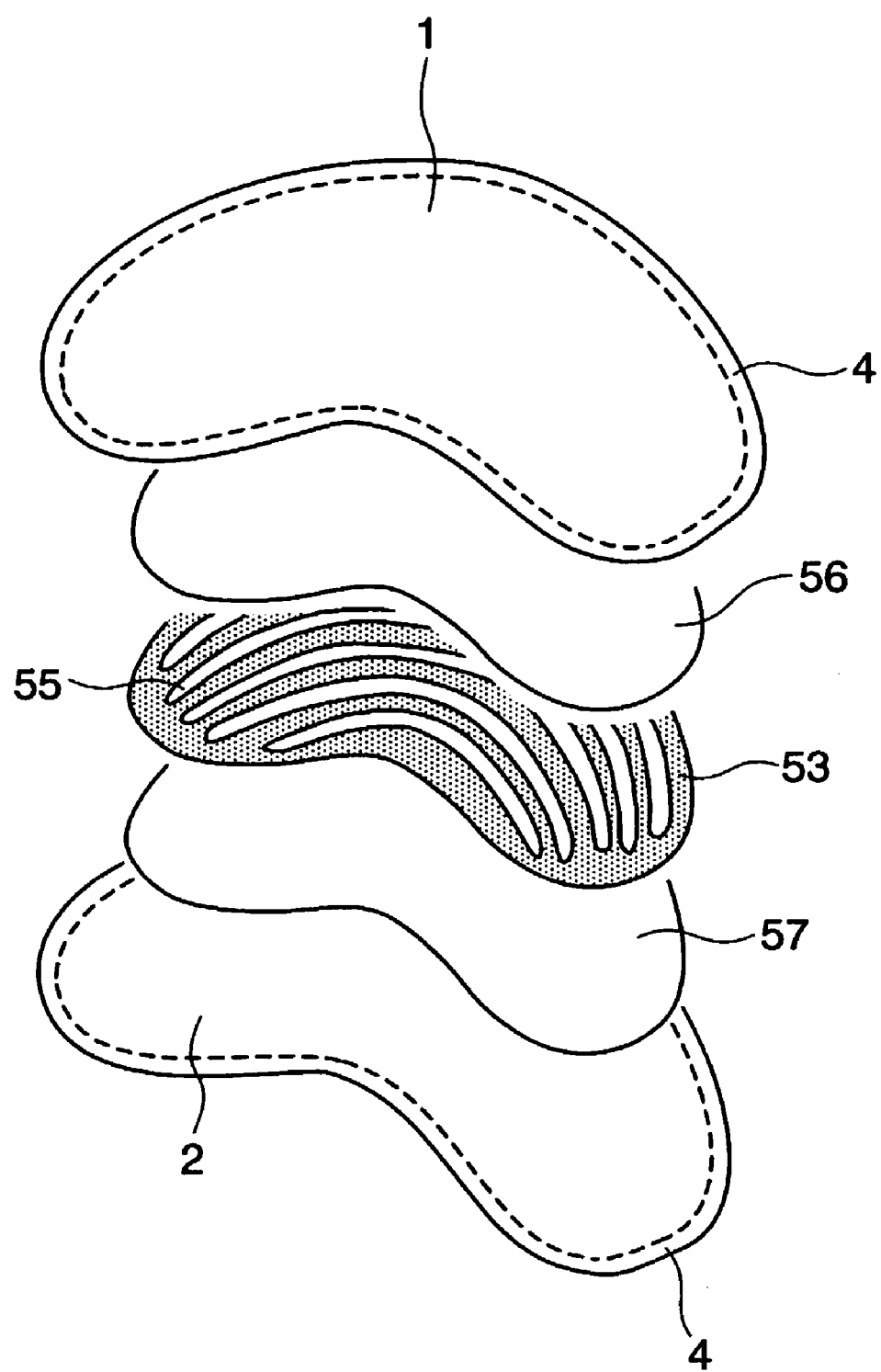
FIG. 11 is a view for illustrating a thin sheet type heat pipe according to another embodiment of the present invention.

FIG. 11 is a view for illustrating a thin sheet type heat pipe according to another embodiment of the present invention. As shown in FIG. 11, a thin sheet type heat pipe pf this embodiment comprises: a hermetically sealed container of curved shape which is formed of two foil sheets 1 and 2 jointed at peripheral portions 4; one spacer which is movably arranged in the container and has curved fluid paths to exert a capillary force; two spacers having no fluid path; and a working fluid enclosed in the container.

The shape of the spacer corresponds to that of the container. The above-described spacers comprise a first spacer 53 which has curved fluid paths 55 formed in parallel and in the longitudinal direction and third spacers 56 and 57 which have no fluid path. The first spacer 53 is sandwiched by the third spacers 56 and 57, which are all movably arranged in the container.

Figure 17:
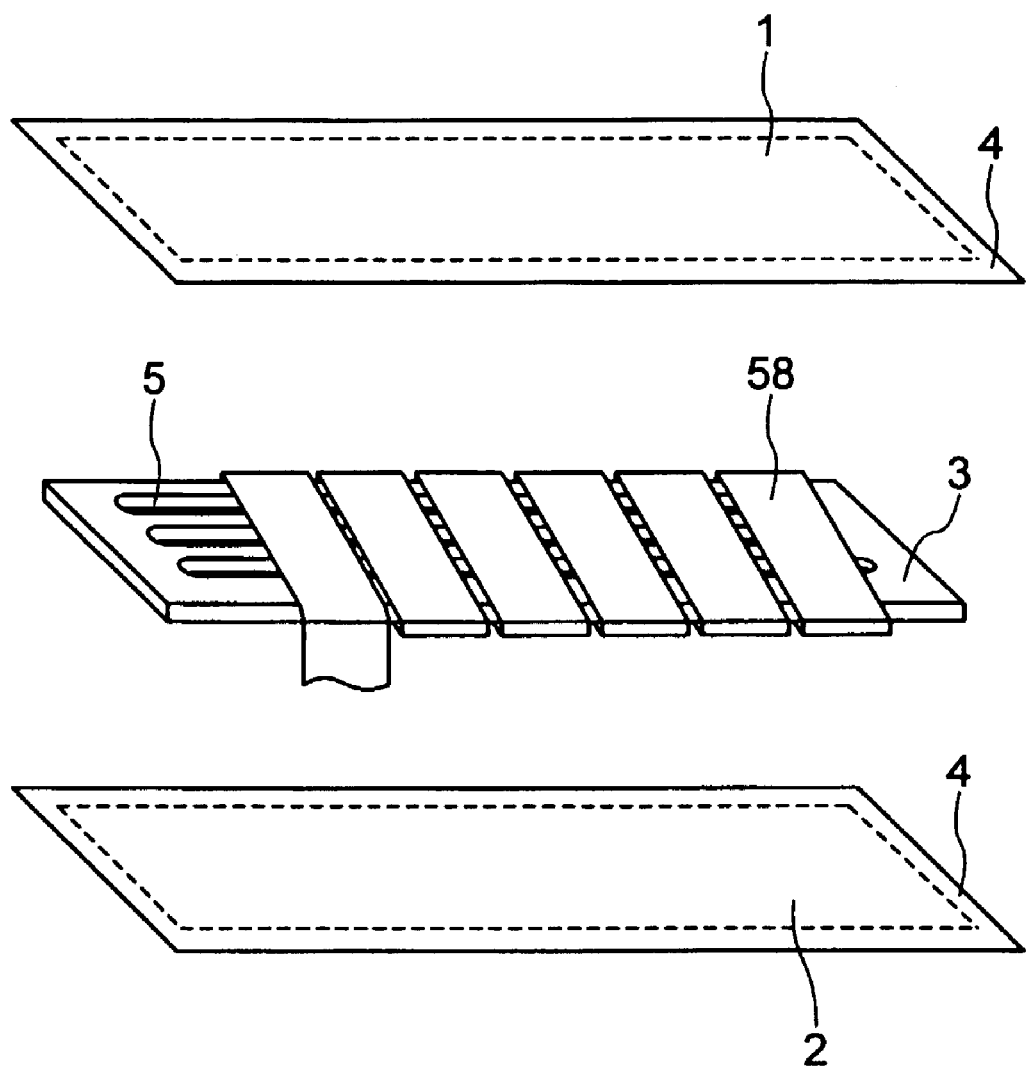
FIG. 17 is a view for illustrating a thin sheet type heat pipe according to yet another embodiment of the present invention.

FIG. 17 is a view for illustrating a thin sheet type heat pipe according to yet another embodiment of the present invention. A thin sheet type heat pipe of the embodiment shown in FIG. 17 comprises: a hermetically sealed container which is formed of two foil sheets 1 and 2 jointed at peripheral portions 4; one spacer 3 which movably arranged in the container and has fluid paths 5 to exert a capillary force, a cover 58 being wrapped in a spiral fashion around said spacer; and a working fluid enclosed in the container. As shown in this embodiment, a foil used in the cover is wrapped in a flat and spiral fashion, partially or fully around a spacer having fluid paths, which thereby facilitates bending of the spacer. Accordingly, it is effective when a heat pipe has to be bent.

Another embodiment of forming of the above-described container is as follows: one foil sheet is folded at the center into two and jointed at peripheral portions to form a hermetically sealed container. According to this embodiment, it becomes possible to reduce the number of members and to achieve a lower cost. In addition, a hermetically sealed container is formed by forming a bag-like foil sheet having an opening and jointing upper and lower portions in layers of the opening.

As described above, it is possible to form a container of any shape. The shape of a fluid path can be changed with changing of a punching press used for a spacer, which allows to produce in volume spacers of a desired shape, thereby enabling significant increase in design freedom.

As described above, the present invention allows to provide a high-performance thin sheet type heat pipe which is thin, flexible and excellent in heat transferability and in design freedom.

What is claimed is:

1. A thin sheet type heat pipe comprising:
   a hermetically sealed container which is formed of foil sheets opposed and jointed at peripheral portions;
   at least one spacer including a sheet having a fluid path in a form of a slit and exerting a capillary force, which is movably housed in said container; and
   a working fluid enclosed in said container;
   wherein said at least one spacer comprises:
   a first spacer which is a sheet with a plurality of fluid paths formed in parallel and in a longitudinal direction of the sheet;
   and two third spacers which are sheets with no fluid path, said first spacer being sandwiched by said two third spacers, and said first spacer and said two third spacers being movably arranged.

2. The thin sheet type heat pipe according to claim 1, wherein said at least one spacer comprises: a first spacer which is a sheet with a fluid path formed in a longitudinal direction of the sheet; and a second spacer which is a sheet with a fluid path formed in a direction perpendicular to the fluid path of said first spacer, said first spacer and said second spacer being arranged movably.

3. The thin sheet type heat pipe according to claim 1, wherein said two third spacers are different in thickness from each other.

4. The thin sheet type heat pipe according to claim 1, wherein said at least one spacer comprises one-piece spacers of at least two out of three kinds including: a first spacer which is a sheet with a fluid path formed in a longitudinal direction of the sheet; a second spacer which is a sheet with a fluid path formed in a direction perpendicular to the fluid path of said first spacer; and a third spacer which is a sheet with no fluid path, a plurality of holes being provided between said one-piece spacers of different kinds, said one piece spacers being folded at a portion at which the holes are formed in such a manner that one spacer of the one-piece spacers is superimposed on another.

5. The thin sheet type heat pipe according to claim 2, wherein said second spacer is made of a mesh.

6. The thin sheet type heat pipe according to claim 1, wherein said at least one spacer comprises: a first spacer which is a sheet with a plurality of fluid paths formed in parallel and in a longitudinal direction of the sheet; and two fourth spacers which are sheets each having communication paths at portions corresponding to ends of the fluid paths of said first spacer and having a plurality of holes at a predetermined portion in a center part, said first spacer being sandwiched by said two fourth spacers, the foils of said container being jointed by spot welding at portions corresponding to the holes of the fourth spacers so that the spacers are movably arranged.

7. The thin sheet type heat pipe according to claim 1, wherein said first spacer is formed of a mesh sheet.

8. The thin sheet type heat pipe according to claim 1, wherein said first spacer is formed by wrapping a mesh around a sheet of the spacer.

9. The thin sheet type heat pipe according to claim 1, wherein said first spacer is formed of a tatami mesh.

10. The thin sheet type heat pipe according to claim 2, wherein a surface of said first spacer, said second spacer, each of said third spacers or each of said fourth spacers is finely roughened.

11. A thin sheet type heat pipe comprising:
    a hermetically sealed container which is formed of foil sheets opposed and jointed at peripheral portions;
    at least one spacer including a sheet which is movably housed in said container, exerts a capillary force and has a fluid path in a form of a slit;
    at least one spacer including a sheet which is movably housed in said container and has no fluid path; and
    a working fluid enclosed in said container.

12. The thin sheet type heat pipe according to claim 11, wherein said at least one spacer having a fluid path comprises at least two stacked spacers which have fluid paths of same shape.

13. The thin sheet type heat pipe according to claim 11, wherein said at least one spacer having a fluid path comprises at least two stacked spacers which have fluid paths of different shape.

14. The thin sheet type heat pipe according to claim 12, wherein said at least two stacked spacers are fixed to each other.

15. The thin sheet type heat pipe according to claim 11, wherein said at least one spacer with no fluid path comprises stacked spacers of foil or porous sheets or stacked spacers of both of a foil sheet and a porous sheet.

16. The thin sheet type heat pipe according to claim 11, wherein said at least one spacer with no fluid path is arranged in parallel with one surface of said at Least one spacer with a fluid path, when said at least one spacer with no fluid path comprises at least two spacers, said spacers with no fluid path sandwiches said at least one spacer with a fluid path, or said at least one spacer with no fluid path is wrapped in a spiral fashion around said at least one spacer with a fluid path.

17. The thin sheet type heat pipe according to claim 11, wherein a cross section of said fluid path has a width of from 1.5 mm to 3 mm inclusive and a height of from 0.3 mm to 1.0 mm inclusive.

18. The thin sheet type heat pipe according to claim 11, wherein said at least one spacer with no fluid path has a thickness of from 0.05 mm to 0.15 mm inclusive.

* * * * *